(12) United States Patent
Jimenez et al.

(10) Patent No.: US 11,180,130 B2
(45) Date of Patent: Nov. 23, 2021

(54) LANDING GEAR TEMPERATURE CHARACTERISTIC

(71) Applicants: AIRBUS OPERATIONS LIMITED, Bristol (GB); AIRBUS OPERATIONS (S.A.S.), Toulouse (FR); AIRBUS (S.A.S.), Blagnac (FR)

(72) Inventors: Rodrigo Jimenez, Bristol (GB); Brice Cheray, Bristol (GB); Maud Consola, Bristol (GB)

(73) Assignees: AIRBUS OPERATIONS LIMITED, Bristol (GB); AIRBUS OPERATIONS (S.A.S.), Toulouse (FR); AIRBUS (S.A.S.), Blagnac (FR)

( * ) Notice: Subject to any disclaimer, the term of this patent is extended or adjusted under 35 U.S.C. 154(b) by 261 days.

(21) Appl. No.: 16/356,567

(22) Filed: Mar. 18, 2019

(65) Prior Publication Data
US 2019/0283728 A1    Sep. 19, 2019

(30) Foreign Application Priority Data
Mar. 19, 2018  (GB) ..................................... 1804388

(51) Int. Cl.
*B60T 17/22* (2006.01)
*B64F 5/60* (2017.01)
(Continued)

(52) U.S. Cl.
CPC .............. *B60T 17/22* (2013.01); *B60T 8/172* (2013.01); *B60T 8/1703* (2013.01);
(Continued)

(58) Field of Classification Search
CPC ........ B60T 17/22; B60T 8/1703; B60T 8/172; B60T 17/221; B60T 2240/00;
(Continued)

(56) References Cited

U.S. PATENT DOCUMENTS

| 3,138,406 A | 6/1964 | Chamberlain |
| 3,200,987 A | 8/1965 | Horner et al. |

(Continued)

FOREIGN PATENT DOCUMENTS

| DE | 102011103797 | 12/2012 |
| EP | 0443213 | 8/1991 |

(Continued)

OTHER PUBLICATIONS

European Search Report for European Application No. 19162997.1, eight pages, dated Aug. 5, 2019.

(Continued)

*Primary Examiner* — Anne Marie Antonucci
(74) *Attorney, Agent, or Firm* — Nixon & Vanderhye P.C.

(57) ABSTRACT

An apparatus and method is disclosed for determining a temperature characteristic at a first location on a wheel or a brake assembly of an aircraft landing gear. The temperature characteristic at the first location is determined using relationship information based on a first temperature at a second location of the wheel or the brake assembly of the landing gear, the relationship information representing a relationship between the temperature characteristic at the first location and the first temperature. Also disclosed is a method to determine the relationship information.

22 Claims, 6 Drawing Sheets

(51) Int. Cl.
*B64D 45/00* (2006.01)
*B64C 25/42* (2006.01)
*F16D 66/00* (2006.01)
*B60T 8/17* (2006.01)
*B60T 8/172* (2006.01)
*G01K 7/42* (2006.01)

(52) U.S. Cl.
CPC ............ *B60T 17/221* (2013.01); *B64C 25/42* (2013.01); *B64D 45/00* (2013.01); *B64F 5/60* (2017.01); *F16D 66/00* (2013.01); *G01K 7/427* (2013.01); *B60T 2240/00* (2013.01); *B64D 2045/0085* (2013.01); *F16D 2066/001* (2013.01)

(58) Field of Classification Search
CPC .. G01K 7/427; G01K 3/00; B64F 5/60; B64F 5/00; B64C 25/42; B64C 25/34; B64D 45/00; B64D 2045/0085; G01R 31/52; G01R 31/54
See application file for complete search history.

(56) References Cited

U.S. PATENT DOCUMENTS

| | | | |
|---|---|---|---|
| 3,269,402 A | 8/1966 | Horner | |
| 3,582,926 A | 6/1971 | Hassan | |
| 3,645,479 A | 2/1972 | Kostroun et al. | |
| 4,535,957 A | 8/1985 | Bischoff et al. | |
| 8,151,944 B2 | 4/2012 | Waltz | |
| 9,242,739 B2 | 1/2016 | Martin | |
| 9,797,780 B2 | 10/2017 | Kuroyama et al. | |
| 2004/0129309 A1 | 7/2004 | Eckert et al. | |
| 2014/0354185 A1 | 12/2014 | Yoshida | |
| 2015/0145703 A1* | 5/2015 | Martin | B60T 8/1703 340/960 |
| 2015/0286215 A1 | 10/2015 | Alvarado et al. | |
| 2016/0305826 A1 | 10/2016 | Miller | |
| 2018/0094990 A1 | 4/2018 | Rud et al. | |

FOREIGN PATENT DOCUMENTS

| | | |
|---|---|---|
| EP | 1418372 | 5/2004 |
| EP | 2876012 | 5/2015 |
| EP | 3088266 | 11/2016 |
| EP | 3159232 | 4/2017 |

OTHER PUBLICATIONS

Miller et al. "Tire Pressure & Brake Temperature Monitoring for your 737 MAX" Crane Aerospace & Electronics three pages, dated Jan. 16, 2018.

* cited by examiner

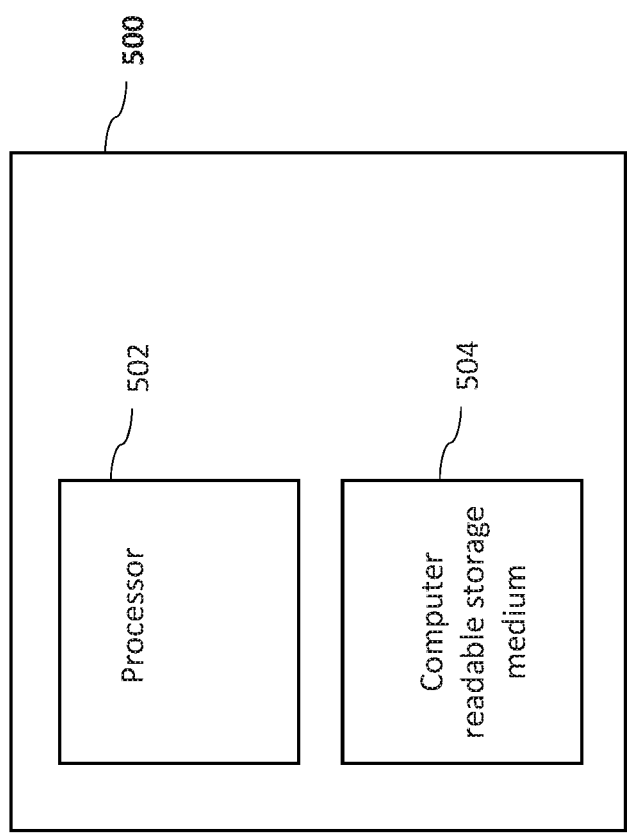

LANDING GEAR TEMPERATURE CHARACTERISTIC

CROSS RELATED APPLICATION

This application claims priority to United Kingdom (GB) Patent Application 1804388.5, filed Mar. 19, 2018, the entire contents of which are hereby incorporated by reference.

TECHNICAL FIELD

The present invention relates to determining a temperature characteristic at a particular location of an aircraft landing gear. Particularly, but not exclusively, the location may be a wheel or a brake assembly of an aircraft landing gear.

BACKGROUND

A wheel of an aircraft landing gear may be provided with a fuse plug. A fuse plug is a safety device which may be used in closed cavities to relieve pressure when high temperatures are reached. Aircraft wheels may have fuse plugs to mitigate the effects of very high gas pressure caused by high temperatures inside a tyre of the wheel.

SUMMARY

A first aspect of the present invention provides an apparatus for determining a temperature characteristic at a first location on a wheel or a brake assembly of an aircraft landing gear, the apparatus comprising: a processor configured to: determine a temperature characteristic at a first location, using relationship information based on a first temperature at a second location of a wheel or a brake assembly of an aircraft landing gear, the relationship information representing a relationship between the temperature characteristic at the first location and the first temperature.

Optionally, the first location is the location of a fuse plug of a wheel of an aircraft landing gear and the second location is the location of a brake disc of a brake assembly of the aircraft landing gear.

Optionally, the temperature characteristic comprises a determined second temperature at the first location; and the relationship information comprises an indication of the relationship between a temperature at the first location and a temperature at the second location.

Optionally, the temperature characteristic comprises a determined temperature increase, above the first temperature, the second location can undergo without causing the temperature at the first location to reach a temperature threshold.

Optionally, the processor is configured to determine a number of good braking applications that can take place in the remainder of a current braking cycle based on the determined temperature increase and a predetermined temperature increase corresponding to one or more braking applications.

Optionally, the temperature characteristic comprises a determined amount of energy the brake assembly can absorb, which is in addition to the absorbed energy corresponding to the first temperature, without causing the temperature at the first location to reach a temperature threshold, using the physical properties of the brake assembly.

Optionally, the processor is configured to determine a number of good braking applications that can take place in the remainder of a current braking cycle based on the determined amount of energy and a predetermined energy value corresponding to one or more braking applications.

Optionally, the temperature characteristic comprises a determined time delay between the first temperature occurring at the second location and the second temperature occurring at the first location; and the relationship information comprises an indication of the relationship between the determined time delay and the first temperature.

Optionally, the temperature characteristic comprises determined temperature variation information of the temperature at the first location; the relationship information comprises an indication of the relationship between the determined temperature variation information and the first temperature; and the processor is configured to determine a temperature profile of the first location with respect to time based on the temperature characteristic and the environmental temperature.

Optionally, the determined temperature variation information comprises a heating time constant and a cooling time constant.

Optionally, the processor is configured to determine a cooling time for the temperature at the first location to fall below a reference temperature limit based on the temperature profile.

Optionally, the processor is configured to provide an indication on the basis of the temperature characteristic at the first location.

Optionally, the processor is configured to recalculate the temperature characteristic after a braking event which occurs subsequent to the first temperature.

A second aspect of the present invention provides a method for determining a temperature characteristic at a first location on a wheel or a brake assembly of an aircraft landing gear, the method comprising: inputting a first temperature at a second location of a wheel or a brake assembly of an aircraft landing gear; and determining a temperature characteristic at a first location, using relationship information based on the first temperature, the relationship information representing a relationship between the temperature characteristic at the first location and the first temperature.

Optionally, in the method according to the second aspect: the temperature characteristic comprises a determined second temperature at the first location; and the relationship information comprises an indication of the relationship between a temperature at the first location and a temperature at the second location.

Optionally, in the method according to the second aspect the temperature characteristic comprises a determined temperature increase, above the first temperature, the second location can undergo without causing the temperature at the first location to reach a temperature threshold.

Optionally, the method according to second aspect comprises determining a number of good braking applications that can take place in the remainder of a current braking cycle based on the determined temperature increase and a predetermined temperature increase corresponding to one or more braking applications.

Optionally, in the method according to the second aspect the temperature characteristic comprises a determined amount of energy the brake assembly can absorb, which is in addition to the absorbed energy corresponding to the first temperature, without causing the temperature at the first location to reach a temperature threshold, using the physical properties of the brake assembly.

Optionally, the method according to the second aspect comprises determining a number of good braking applications that can take place in the remainder of a current braking cycle based on the determined amount of energy and a predetermined energy value corresponding to one or more braking applications.

Optionally, in the method according to the second aspect: the temperature characteristic comprises a determined time delay between the first temperature occurring at the second location and the second temperature occurring at the first location; and the relationship information comprises an indication of the relationship between the determined time delay and the first temperature.

Optionally, in the method according to the second aspect: the temperature characteristic comprises determined temperature variation information of the temperature at the first location; the relationship information comprises an indication of the relationship between the determined temperature variation information and the first temperature; and the method comprises determining a temperature profile of the first location with respect to time based on the temperature characteristic and the environmental temperature.

Optionally, the method according to the second aspect comprises: determining a cooling time for the temperature at the first location to fall below a reference temperature limit based on the temperature profile.

Optionally, the method according to the second aspect comprises: recalculating the temperature characteristic after a braking event which occurs subsequent to the first temperature.

A third aspect of the present invention provides a method comprising determining relationship information between a temperature characteristic at a first location of a wheel or a brake assembly of an aircraft landing gear and a temperature at a second location of the wheel or the brake assembly of the aircraft landing gear.

A fourth aspect of the present invention provides an apparatus for determining a plurality of temperature parameters for a first location on a wheel or a brake assembly of an aircraft landing gear, the apparatus comprising: a processor configured to: determine a plurality of temperature parameters at a first location, using dependence information based on a first temperature at a second location of a wheel or a brake assembly of a landing gear, the dependence information indicating the dependence of the plurality of temperature parameters at the first location on the first temperature.

BRIEF DESCRIPTION OF THE DRAWINGS

Embodiments of the invention will now be described, by way of example only, with reference to the accompanying drawings, in which:

FIG. 5 is a schematic view of a computing apparatus for performing examples of the methods of the invention.

DETAILED DESCRIPTION

Figure 1:
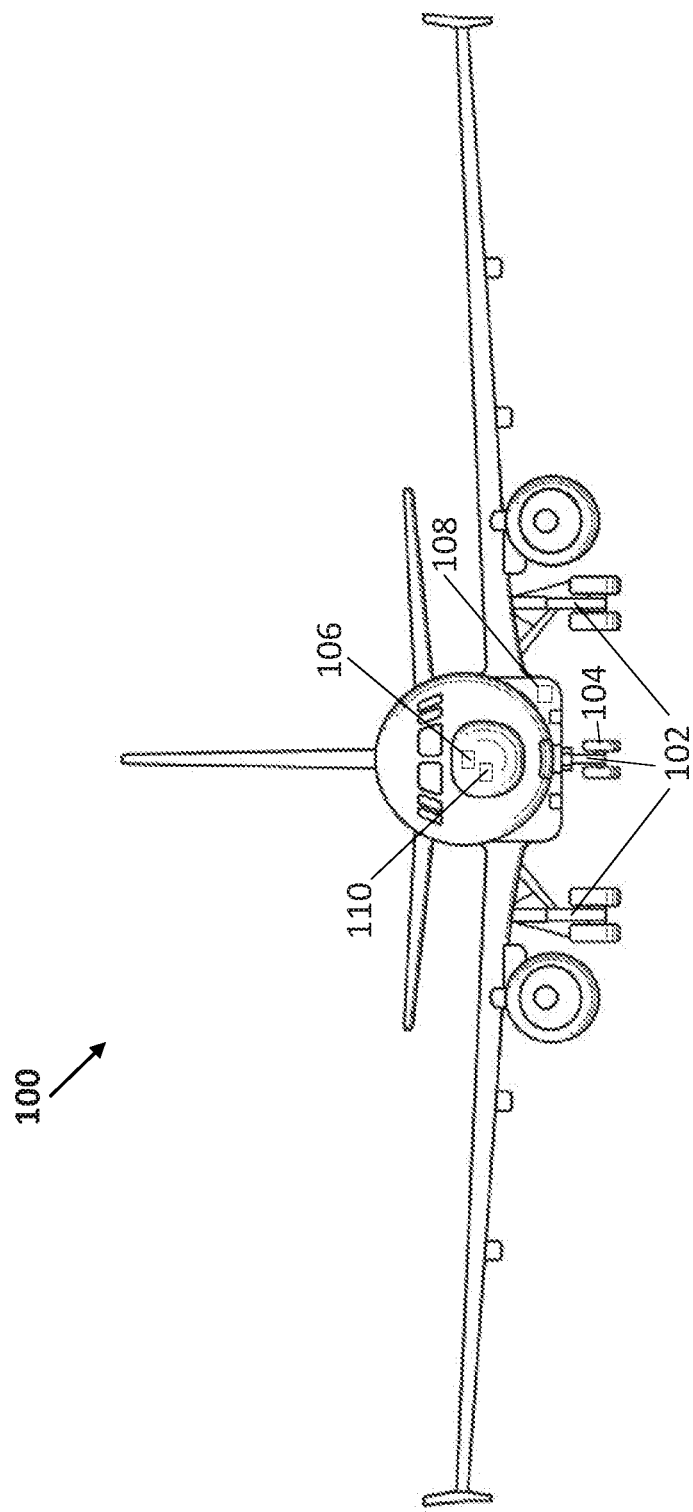
FIG. 1 is a schematic diagram of an aircraft on which examples of the invention may be deployed.

FIG. 1 is a simplified schematic view of an aircraft 100. The aircraft 100 comprises a plurality of landing gear assemblies 102. The landing gear assemblies 102 may include main and nose landing gears that may be extended during take-off and landing. Each landing gear assembly 102 includes wheels such as wheel 104. The aircraft 100 also comprises a computing system 106 comprising one or more processors and one or more computer readable storage media. The aircraft 100 also comprises a set of sensors 108 which may include sensors for measuring environmental characteristics as well as sensors associated with various components of the aircraft 100 and which measure values of various physical properties of respective components. Although the sensors 108 are represented by a single block in the schematic view of FIG. 1, it will be understood that the sensors 108 may be positioned at various different locations on the aircraft 100. The aircraft 100 may also comprises a set of indicating devices 110 for providing various indications relating to the aircraft 100 and the environmental conditions. The indicating devices may include screens which display text and/or graphics, dials, light indicators, sound indicators which emit sound to provide an indication, and the like.

Figure 2:
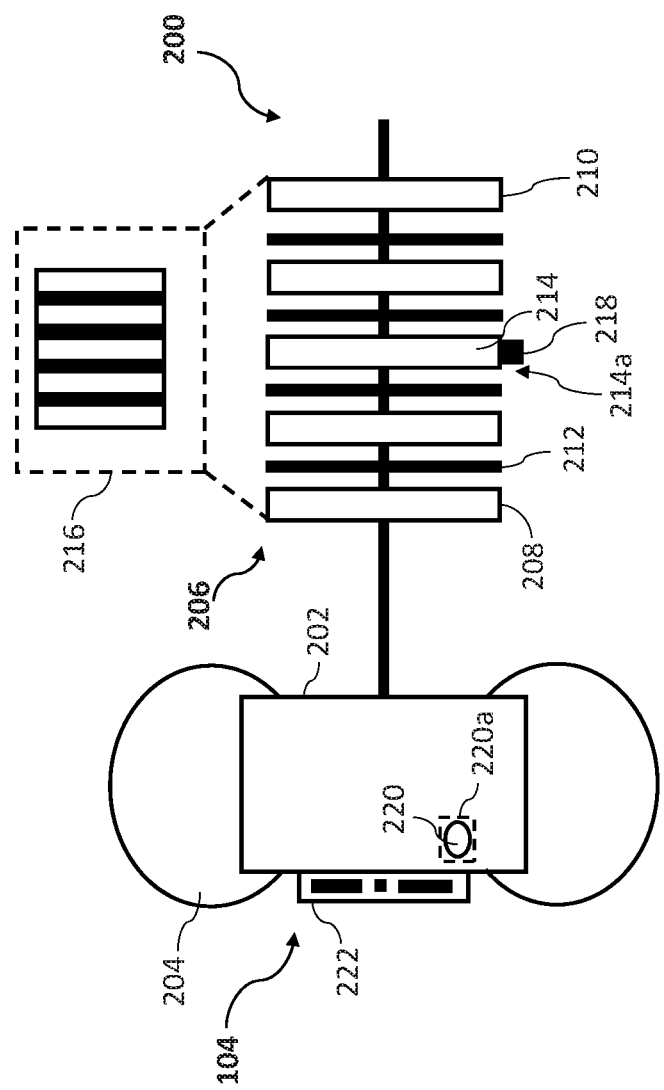
FIG. 2 is a schematic diagram of some components of an aircraft landing gear on which examples of the invention may be deployed.

FIG. 2 is a simplified schematic view of a wheel 104 and an example of an associated brake assembly 200 of a landing gear assembly 102. The wheel 104 includes a wheel body 202 which is surrounded by a tyre 204. The brake assembly 200 includes a plurality of brake discs 206. The brake discs 206 include a pressure plate 208, a reaction plate 210 and a number of rotors and stators, such as rotor 212 and stator 214, between the pressure plate 208 and reaction plate 210. In other examples, there may be any number of rotors and stators different to that shown in FIG. 2. The rotors 212 rotate as the wheel 104 rotates, whereas the stators 214 remain stationary when the wheel 104 rotates. It will be understood that the type of brake used in an aircraft landing gear depends on the characteristics of the aircraft in question, such as size, carrying capacity and the like. There may be more than one wheel associated with any one landing gear assembly.

When the aircraft 100 travels along the ground supported by landing gear assembly 102, the rotors rotate with the wheel 104, whereas the stators, the pressure plate 208 and the reaction plate 210 do not rotate with the wheel 104. When braking is applied, the pressure plate 208 is urged towards the reaction plate 210 so that the brake discs 206 come into contact with one another (as shown in box 216 of FIG. 2) and friction acts to inhibit the rotational motion of the rotors, thus generating a braking force.

One or more applications of the brake assembly 200 may be referred to as a braking event. For example, a braking event may occur when the brake assembly 200 is applied by the pilot(s) of the aircraft 100. A phase of use of the aircraft 100 during which one or more braking events may occur, may be referred to as a braking cycle. For example, the landing phase and subsequent taxiing phase after the landing including several braking events may be a braking cycle.

When braking is applied, the temperature of the brake assembly may rise. In order to monitor the temperature of the brake discs 206, a temperature sensor 218 may be provided. For example, the temperature sensor 218 may be provided on one of the brake discs 206. The temperature sensor 218 may be provided in thermal contact with the brake disc that is likely to, or is known to, reach the highest temperatures during braking. In the example of FIG. 2, the temperature sensor 218 is provided on the stator 214. The temperature sensor 218 may be any type of temperature sensor suitable for use in an aircraft brake assembly. For example, the temperature sensor 218 is able to function properly at the temperature ranges likely to be reached by the brake discs 206. For example, the temperature sensor 218 may be a thermocouple, a surface acoustic wave (SAW) sensor, an eddy current sensor, a resistance thermal sensor, a strain gauge, or the like.

The temperature sensor 218 may measure the temperature of the stator 214 at given measurement intervals during a period of time when use of the brake assembly 200 is expected, for example. The lengths of the given measurement intervals may vary, for example. The given measurement intervals may be regular, irregular or regular for one period of time and irregular for another period of time. For example, a processor of the computing system 106 may control the operation of the temperature sensor 218 based on instructions stored in a computer readable storage medium of the computing system 106. Temperature measurements captured by the temperature sensor 218 may be stored in a computer readable storage medium of the computing system 108, for example, along with associated time data.

As a result of braking applications, the brake assembly 200 may get very hot. For example, the temperature of the brake assembly 200 may exceed 400° C. In some cases, the temperature of the brake assembly 200 may exceed 750° C. For example, the brake assembly 200 may be applied for a high energy braking application when the aircraft 100 is landing. A high energy braking application is an application of the brake assembly 200 which causes a large amount of energy to be absorbed by the brake such that the brake assembly 200 undergoes a large temperature change. For example, a high energy braking application may be a braking application which causes the temperature of the brake assembly 200 to rise by several hundred degrees Celsius. The components of the landing gear assembly 102 close to the brake assembly 200 may also get hot as a result of the increase in the temperature of the brake assembly 200. For example, thermal energy may be transferred from the brake assembly 200 to the wheel 104. An increase in the temperature of the tyre 204 may result in an increase in the gas pressure inside the tyre 204.

To avoid the gas pressure in the tyre 204 of the wheel 104 becoming too high due to such increases in temperature, the wheel 104 may be provided with a safety device 220. The safety device 220 may be a device used in closed vessels, which relieves gas pressure when high temperatures are reached. The safety device 220 may, for example, be a fuse plug 220, which in normal operation plugs an opening in the wheel body 202 between the inside of the tyre and the outside thereof. The fuse plug 220 may be designed to relieve the gas pressure inside the tyre 204 when the temperature at the fuse plug location 220a increases above a temperature threshold. This may be to avoid, for example, damage to the tyre 204.

The fuse plug 220 may be made of a eutectic system, for example. A eutectic system is a homogeneous mixture of materials which have a melting temperature lower than the melting temperature of each individual material. Eutectic systems require a specific amount of each component material. A eutectic system may be in its solid state at temperatures below its eutectic temperature. However, at the eutectic temperature, the eutectic system becomes liquid. The fuse plug 220 for use with the wheel 104 may be designed such that its eutectic temperature is the temperature threshold at which it is desired that the gas pressure inside the tyre 204 be relieved. For example, the fuse plug 220 may melt at the temperature threshold thereby unplugging the opening in the wheel and allowing gas to escape from the tyre 204. This may allow gas to escape from the tyre 204 when the temperature at the fuse plug location 220a reaches the temperature threshold.

The fuse plug 220 may be provided to prevent damage to the tyre due to excessive gas pressure when the aircraft 100 is being used. However, since melting of the fuse plug 220 may result in a flat tyre, this safety measure is useful when the temperature at the fuse plug location 220a reaching the temperature threshold cannot be avoided. For example, maintaining the temperature at the fuse plug location 220a below the temperature threshold may not be desired when high energy braking (which would cause the fuse plug 220 to melt) is required, and decreasing the speed of the aircraft 100 is a priority over the tyre 204 becoming flat.

However, when such high energy braking is not required, it is desired that the temperature at the fuse plug location 220a remains below the temperature threshold. For example, it may be desired that the pilot(s) of aircraft 100 adjust their braking behaviour to keep below the temperature threshold at the fuse plug location 220a. For example, it may be desired that braking is provided by a different brake when fuse plug location 220a associated with brake assembly 200 approaches the temperature threshold.

Figure 3:
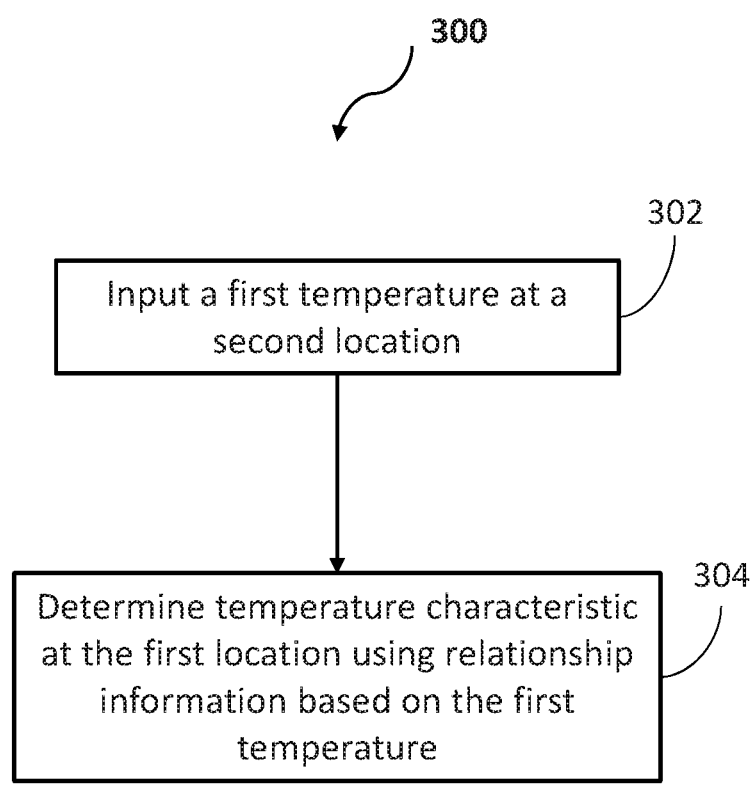
FIG. 3 is a flow diagram of an example method of determining a temperature characteristic at a first location on a wheel or a brake assembly of an aircraft landing gear according to an example.

FIG. 3 is a flow diagram illustrating a method 300 for determining a temperature characteristic at a first location, for example, on the wheel 104 or the brake assembly 200 of an aircraft landing gear 102. The method 300 involves determining the temperature characteristic at the first location, using relationship information based on a first temperature at a second location of the wheel 104 or the brake assembly 200 of the landing gear 102. The relationship information represents a relationship between the temperature characteristic at the first location and the first temperature at the second location. The temperature characteristic may include a plurality of temperature parameters for the first location. The relationship information may also be referred to as dependence information which indicates the dependence of the plurality of temperature parameters at the first location on the first temperature. Therefore, the method 300 is a method for determining a temperature characteristic at a given location, for example, of the wheel 104 or the brake assembly 200 based on a temperature at another, different location of the wheel 104 or a location on the brake assembly 200, for example.

The first location may, for example, be any location on the wheel 104 or the brake assembly 200. The method 300 may, for example, be used to determine the temperature characteristic at a location on the wheel base 202. The method 300 may, for example, be used to determine the temperature characteristic at the fuse plug location 220a. In other examples, the method 300 may be used to determine the temperature characteristic at another location of the wheel 104 or brake assembly 200, such as the reaction plate 208, the compression plate 210, etc. Hereinafter, reference is made to the first location as the fuse plug location 220a.

At block 302 of the method 300, the first temperature at the second location is input. The second location may be any location on the wheel 104 or the brake assembly 200 other than the first location, i.e. other than the fuse plug location 220a in this particular example. For example, the second location may be the stator location 214a of brake assembly 200. In other examples, the second location may be at a different part of the brake assembly 200, such as pressure plate 208, reaction plate 210, etc. In some examples, the second location may be at a location other than at the brake discs 202, such as a part of the wheel base 202 other than the fuse plug location 220a. For example, the second location may be a location on the wheel base 202, and the first location for which the temperature characteristic is determined may be one of the brake discs 206. More generally, in other examples, the method may be used to determine a temperature characteristic at a first given location based on a temperature at a second given location, where temperature relationship information of the kind that is described herein may be established.

The first temperature at the second location according to the present example is a temperature relative to the environmental temperature. The first temperature is a difference between a temperature at the second location and the environmental temperature. For example, the first temperature may be the difference between a peak second location temperature and the environmental temperature. The first temperature may, for example, reflect an increase in the temperature at the second location with respect to the environmental temperature. Hereinafter, according to the present example, reference is made to the second location as the stator location 214a.

For example, the temperature characteristic at the fuse plug location 220a may be determined based on a first temperature at the stator location 214a. In examples where the stator 214 is the brake disc which reaches the highest temperatures, a peak stator location temperature may correspond to a peak brake assembly 200 temperature.

The first temperature may be based on temperature measurements taken by the temperature sensor 218, for example. For example, the temperature sensor 218 may measure the temperature of the stator 214 (i.e. the temperature at the stator location 214a) during a braking event. The temperature measurements may have associated time data. For example, the time at which a particular temperature at the stator location 214a occurred may be known.

In other examples, the first temperature may be determined based on an amount of energy absorbed by the brake during the braking event which causes the first temperature. For example, a given proportion of the kinetic energy of the aircraft 100 may be absorbed by the brake assembly 200 to reduce the kinetic energy of the aircraft 100. For example, it will be understood that when the brake assembly 200 is used, some of the kinetic energy of the aircraft 100 is absorbed into the brake assembly 200 in order to slow the aircraft's movement causing the temperature of the brake assembly 200 to rise. The determination of the first temperature based on an amount of energy absorbed may take account of energy absorbed by the brake assembly 200 during previous braking events and an expected cooling rate of the brake assembly 200, for example. For example, an initial temperature at the stator location 214a may be determined based on an amount of energy absorbed during previous braking events and the expected cooling rate. The peak stator location temperature may be determined by determining an increase in temperature from this initial temperature due to the energy absorbed by the brake during the braking event which causes the first temperature. The first temperature may then be determined as the difference between the peak stator location temperature determined in this manner and the environmental temperature. For example, the instruments 108 of the aircraft 100 may include a tachometer associated with the wheel 104 to which the brake assembly 200 is associated. In such examples, the tachometer measures the rotational speed of the wheel 104, and the energy absorbed by the brake assembly 200 can be determined using the change of the rotational speed with respect to time. In these examples, if the mass and other physical properties of the brake assembly 200 (such as specific heat) are known, the temperature change which the brake assembly 200 undergoes due to the energy absorbed by the brake assembly 200 can be determined. It will be appreciated that if the mass, specific heat of the brake assembly 200 and a temperature change at the brake assembly 200 are known, the energy absorbed by the brake assembly 200 may also be calculated.

In some examples, the first temperature may be determined based on other characteristics or parameters relating to the aircraft 100. For example, a reduction in the speed of the aircraft 100 due to a braking event may be used in order to determine the first temperature. Those skilled in the art will appreciate that from a change in speed, an energy absorbed by the brake assembly 200 may be determined. This is because, when the speed of the aircraft 100 is reduced, some of the kinetic energy of the aircraft 100 is absorbed by the brake assembly 200. In such examples, once the energy absorbed by the brake assembly 200 has been determined, the first temperature may be determined as described above.

In some examples, a predetermined first temperature may be input at block 302. For example, the first temperature may be specified by a processor of the computing system 106 based on information stored in a computer readable storage medium of the computing system 106. For example, predetermined values of the first temperature may be stored in a computer readable storage medium of the computing system 106 to be used as inputs for the method 300. The predetermined values of the first temperature may be determined using a brake temperature model which indicates expected temperature changes at the stator location 214a. The predetermined values of the first temperature may be determined using a computing system or apparatus external to the aircraft 100 and subsequently stored in a computer readable storage medium of the computing system 106. In some examples, the predetermined values of the first temperature may be determined by the computing system 106.

At block 304, the temperature characteristic at the fuse plug location 220a is determined, using the relationship information based on the first temperature. For example, the relationship information represents a relationship between a first temperature at the stator location 214a and the temperature characteristic at the fuse plug location 220a.

The temperature characteristic may, for example, include a determined second temperature at the fuse plug location 220a. The determined second temperature at the first location, according to the present example, is a temperature relative to the environmental temperature. The determined second temperature, according to the present example, is a difference between a temperature at the first location and the environmental temperature. The determined second temperature may, for example, be a difference between a peak temperature at the fuse plug location 220a (i.e. a peak fuse plug location temperature) and the environmental temperature. Therefore, the determined second temperature may be an increase in the temperature at the fuse plug location 220a relative to the environmental temperature. As described above, the components of the landing gear assembly 102 close to the brake assembly 200 may also get hot as a result of the increase in the temperature of the brake assembly 200. Therefore, the determined second temperature may be caused by the first temperature which may occur at the stator 214 due to braking, for example.

Figure 4A:
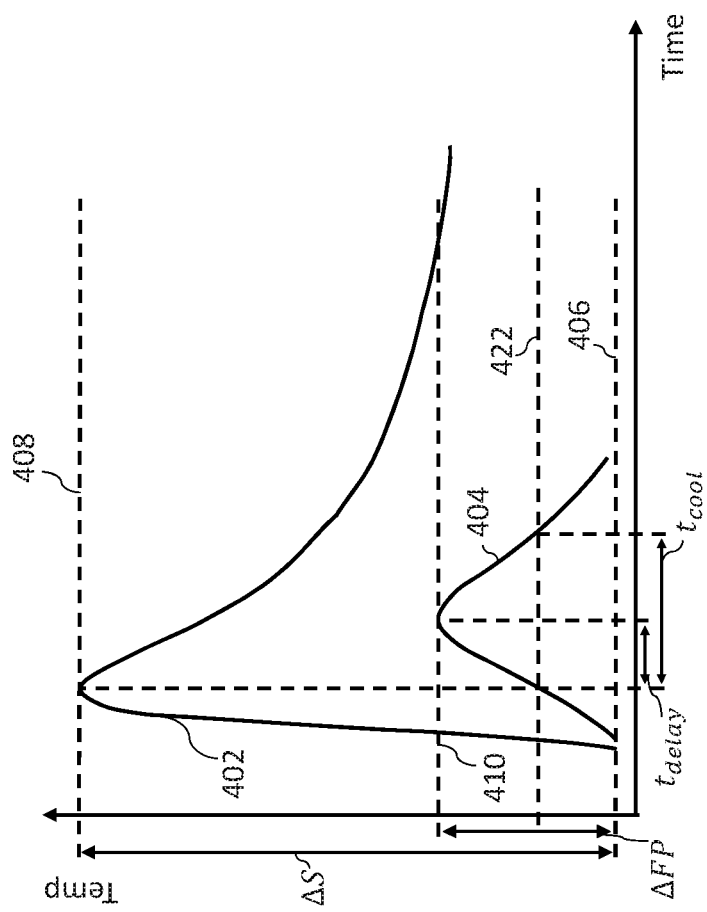
FIG. 4a is a first graph of temperature with respect to time at a first location and a second location of a wheel or a brake assembly of an aircraft landing gear according to an example.

FIG. 4a is a graph of temperature with respect to time. The vertical axis represents temperature and the horizontal axis represents time. In this example, the curve 402 is an example of the temperature with respect to time at the stator location 214a as measured by the temperature sensor 218 and the curve 404 is an example of the temperature with respect to time at the fuse plug location 220a, which has been determined according to examples herein. The curve 404 may also be referred to as the temperature profile of the fuse plug location 220a with respect to time. The curve 402 may be an example of the temperature variation at the stator location 214a caused by a braking event and the temperature profile 404 may be a consequent variation in the temperature at the fuse plug location 220a. The curve 402 shows that the temperature at the stator location 214a increases from a temperature 406 to a temperature 408. In this example, the temperature 406 is the environmental temperature. The difference between the environmental temperature 406 and the temperature 408 at the stator location 214a is the first temperature $\Delta S$ in this example. The temperature 408 is the peak stator location temperature in this example.

In this example, due to heat transfer from the stator location 214a to the fuse plug location 220a, the temperature at the fuse plug location 220a increases from the environmental temperature 406 to the temperature 410. In this example, the temperature 410 is the peak fuse plug location temperature. The difference between the environmental temperature 406 and the temperature 410 at the fuse plug location 220a is the determined second temperature $\Delta FP$ in this example. In this particular example, as can be seen from the curve 402 and the temperature profile 404 in FIG. 4a, the initial temperature at the stator location 214a and the fuse plug location 220a is the environmental temperature 406. This may, for example, occur when a braking event is performed after a long period of time during which the brake assembly 200 was not used, allowing the stator location 214a temperature and the fuse plug location 220a temperature to become similar to the environmental temperature. In some examples, the respective initial temperatures at the stator location 214a and the fuse plug location 220a may not be the same as one another and/or may not be the same as the environmental temperature 406. However, for the present purposes, it should be appreciated that in such examples, the first temperature $\Delta S$ is still the difference between the peak stator location temperature 408 and the environmental temperature 406, and the determined second temperature $\Delta FP$ is still the difference between the peak fuse plug location temperature 410 and the environmental temperature 406.

The relationship information may include an indication of a relationship between a temperature at the fuse plug location 220a and a temperature at the stator location 214a. In the examples where the temperature characteristic includes the determined second temperature $\Delta FP$, the relationship information may indicate the relationship between the determined second temperature $\Delta FP$ and the first temperature $\Delta S$. For example, the relationship information may include a mathematical relationship between the first temperature $\Delta S$ and the determined second temperature $\Delta FP$. The relationship between the first and second temperatures may, for example, be expressed as an algebraic expression. For example, the relationship between the first and second temperatures may be expressed as a linear function, a quadratic function, a polynomial function, a power function, a rational function, an exponential function, a logarithmic function, an exponential function or a combination of any of these functions. In one example, the relationship information indicates a relationship between the first and second temperatures as shown in Equation 1 below.

$$\Delta FP = A\Delta S^2 + B\Delta S + C \quad (1)$$

In Equation 1 above, $\Delta S$ is the first temperature as in the example of FIG. 4a, $\Delta FP$ is the second temperature as in the example of FIG. 4a, and A, B and C are constants. Equation 1 is therefore a quadratic function expressing the relationship between the first temperature $\Delta S$ and the second temperature $\Delta FP$. The determination of the form of the relationship (i.e. which combination of functions makes up the relationship) between the first temperature $\Delta S$ and the second temperature $\Delta FP$, and the determination of the values of the constants A, B and C, is described in more detail further below.

The values of the constants A, B and C may, for example, vary depending on the wear state of the brake assembly 200. The wear state of brake assembly 200 may be expressed as two or more different levels of brake wear. The brake assembly 200 may be provided with a brake cooling fan 222 for cooling the brake assembly 200. The values of the constants A, B and C may also vary depending on whether the brake cooling fan 222 is on or off. For example, there may be a different set of respective values of the constants A, B and C for each combination of the wear state of the brake assembly 200 and the brake cooling fan 222 being on or off.

In examples where the temperature characteristic includes the determined second temperature $\Delta FP$, the determined second temperature $\Delta FP$ may be determined at block 304 using Equation 1 based on the first temperature $\Delta S$ which is input at block 302.

The temperature characteristic may, for example, comprise a determined time delay between the first temperature $\Delta S$ occurring at the stator location 214a and the determined second temperature $\Delta FP$ occurring at the fuse plug location 220a. The determined time delay may be an indication of how much time it takes for the fuse plug location 220a to reach the peak fuse plug location temperature 410 after the stator location 214a reaches the peak stator location temperature 408. In the example of FIG. 4a, the determined time delay $t_{delay}$ is shown.

In examples where the temperature characteristic comprises the determined time delay $t_{delay}$, the relationship information comprises an indication of the relationship between the determined time delay $t_{delay}$ and the first temperature $\Delta S$. For example, the relationship information may include a mathematical relationship between the first temperature $\Delta S$ and the determined time delay $t_{delay}$. The relationship between the first temperature $\Delta S$ and the determined time delay $t_{delay}$ may, for example, be expressed as an algebraic expression, as in the case of the relationship between the first and second temperatures described above. For example, the relationship between the first temperature $\Delta S$ and the determined time delay $t_{delay}$ may be expressed as a linear function, a quadratic function, a polynomial function, a power function, a rational function, an exponential function, a logarithmic function and/or an exponential function. In one example, the relationship information indicates a relationship between the first temperature $\Delta S$ and the determined time delay $t_{delay}$ as shown in Equation 2 below.

$$t_{delay} = De^{E \times \Delta S} \quad (2)$$

In Equation 2 above, D and E are constants, and e is the exponential constant. The ways in which the constants D and E, and the form of the relationship between the first temperature ΔS and the determined time delay $t_{delay}$ may be determined are described further below. As for constants A, B and C described above, the values of constants D and E may, for example, vary depending on the wear state of the brake assembly 200 and depending on whether the brake cooling fan 222 is on or off. For example, there may be a different set of respective values of the constants D and E for each combination of the wear state of the brake assembly 200 and the brake cooling fan 222 being on or off. It will be clear that in examples where the temperature characteristic includes the determined time delay $t_{delay}$, the determined time delay $t_{delay}$ may be determined at block 304 using Equation 2 based on the first temperature ΔS which is input at block 302.

The temperature characteristic may, for example, comprise determined temperature variation information of the temperature at the fuse plug location 220a. The temperature characteristic may, for example, include a heating time constant $\alpha_H$ and/or a cooling time constant $\alpha_C$. In examples where the temperature characteristic includes the determined temperature variation information such as the heating time constant $\alpha_H$ and/or the cooling time constant $\alpha_C$, the relationship information may include an indication of the relationship between the determined temperature variation information and the first temperature ΔS. The relationship between the first temperature ΔS and the determined temperature variation information may, for example, be expressed as an algebraic expression, as in the above examples. For example, the relationship between the first temperature ΔS and the determined temperature variation information may be expressed as a linear function, a quadratic function, a polynomial function, a power function, a rational function, an exponential function, a logarithmic function, an exponential function, or any combination of these. In examples where the determined temperature variation information includes the heating time constant $\alpha_H$ and the cooling time constant $\alpha_C$, the relationship information may indicate a relationship as shown in Equation 3 and Equation 4 below.

$$\alpha_H = F_H \times \Delta S + G_H \qquad (3)$$

$$\alpha_C = F_C \times \Delta S + G_C \qquad (4)$$

In Equation 3 above, $\alpha_H$ represents the heating time constant. The parameters $F_H$ and $G_H$ are constants and the manner in which they may be determined is described further below. Similarly to the above examples, the values of constants $F_H$ and $G_H$ may, for example, vary depending on the wear state of the brake assembly 200 and depending on whether the brake cooling fan 222 is on or off. For example, there may be a different set of respective values of the constants $F_H$ and $G_H$ for each combination of the wear state of the brake assembly 200 and the brake cooling fan 222 being on or off. Equation 3 may be used to determine the heating time constant $\alpha_H$ at block 304 based on the first temperature ΔS which is input at block 302.

In equation 4 above, $\alpha_C$ represents the cooling time constant. The parameters $F_C$ and $G_C$ are constants and the manner in which they may be determined is described further below. Similarly to the above examples, the values of constants $F_C$ and $G_C$ may, for example, vary depending on the wear state of the brake assembly 200 and depending on whether the brake cooling fan 222 is on or off. For example, there may be a different set of respective values of the constants $F_C$ and $G_C$ for each combination of the wear state of the brake assembly 200 and the brake cooling fan 222 being on or off. Equation 4 may be used to determine the cooling time constant $\alpha_C$ at block 304 based on the first temperature ΔS which is input at block 302.

In some examples where the temperature characteristic includes the determined temperature variation information, a temperature profile 404 of the fuse plug location 220a with respect to time may be determined based on the temperature characteristic and the environmental temperature 406. For example, the temperature profile 404 may be determined as part of block 304 of the method 300. As mentioned above, curve 404 of FIG. 4a is an example of a temperature profile at the fuse plug location 220a. In some examples, the variation of the temperature with respect to time at the fuse plug location 220a may be described using Newton's law of heating. The variation of the temperature at the fuse plug location 220a may, for example, be expressed as in Equations 5 and 6 below.

$$T_H(t) = T_{max} - (T_{max} - T_0) \times e^{-\alpha_H \times t} \qquad (5)$$

$$T_C(t) = T_{Env} + (T_{max} - T_{Env}) \times e^{-\alpha_C \times (t - t_{delay})} \qquad (6)$$

In Equation 5 above, $T_H(t)$ represents the temperature at the fuse plug location 220a with respect to (i.e. as a function of) time when the temperature at the fuse plug location 220a is increasing. $T_{max}$ is the value of the peak fuse plug location temperature 410 determined according the determined second temperature ΔFP, $T_0$ is the initial temperature at the fuse plug location 220a, and t is time. As above, $\alpha_H$ represents the heating time constant. The initial temperature $T_0$ may be equal to the environmental temperature 406 in examples where the brake assembly 200 has not recently been used such that the stator 214 has had sufficient time since any previous braking applications to cool to the environmental temperature 406. In some examples, the initial temperature $T_0$ may not be equal to the environmental temperature 406, and may be determined in accordance with the temperature profile at the fuse plug location 220a resulting from a previous braking event. Equation 5 may, for example, be used to determine the temperature profile 404 at times before the peak fuse plug location temperature 410 (i.e. the temperature value $T_{max}$) is reached. For example, Equation 5 may be used to determine the temperature up until the time at which the peak fuse plug location temperature 410 is reached as expected according to the determined time delay $t_{delay}$.

In Equation 6 above, $T_C(t)$ represents the temperature at the fuse plug location 220a with respect to (i.e. as a function of) time when the temperature at the fuse plug location 220a is decreasing after reaching the peak fuse plug location temperature 410. $T_{Env}$ is the environmental temperature 406. As above, $\alpha_C$ represents the cooling time constant. Equation 6 may, for example, be used to determine the temperature profile 404 at times after the peak fuse plug location temperature 410 (i.e. $T_{max}$ in Equations 5 and 6) is reached. For example, Equation 6 may be used to determine the temperature after the time at which the peak fuse plug location temperature 410 is reached as expected according to the determined time delay $t_{delay}$.

The temperature profile 404 may therefore be determined in examples where the temperature characteristic includes the determined temperature variation information, as well as the determined second temperature ΔFP and the determined time delay $t_{delay}$.

As described above, in certain circumstances it may be desired that the temperature at the fuse plug location 220a remain below the temperature threshold such that the fuse plug 220 does not melt to relieve the gas pressure in the tyre 204. Based on the temperature characteristic at the fuse plug location 220a, an indication may, for example, be provided. For example, an indication may be provided using one of the indicating devices 110 of the aircraft 100. For example, if the peak fuse plug location temperature 410 as a result of the determined second temperature ΔFP, approaches close to the temperature threshold, an indication may be provided to the pilot(s) of the aircraft 100. A processor of the computing system 106, for example, may provide the indication to the pilot(s) using one of the indicating devices 110. The indication may inform the pilot(s) that the temperature at the fuse plug location 220a has approached close to the temperature threshold. The pilot(s) may in response change their braking behaviour to maintain the fuse plug location below the temperature threshold.

In some examples, in response to a processor of the computing system 106 determining that the peak fuse plug location temperature 410 has approached close to the temperature threshold, the processor may automatically cause a different brake than brake assembly 200 to be used for braking. This may be so that the brake assembly 200 is no longer used if the temperature of the fuse plug location 220a has gotten too close to the temperature threshold.

Figure 4B:
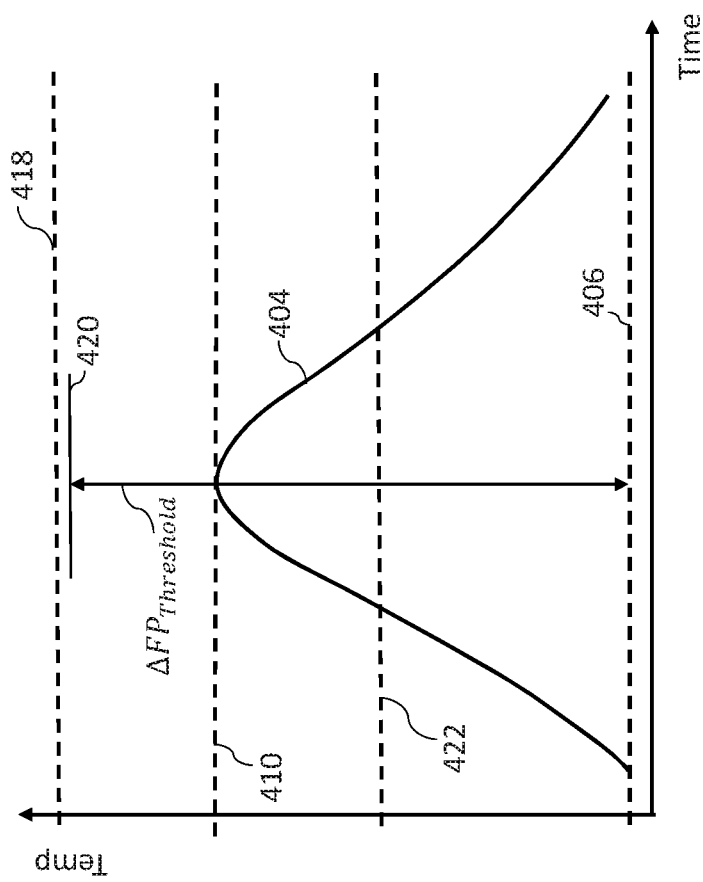
FIG. 4b is a second graph of temperature with respect to time at a first location of a wheel or a brake assembly of an aircraft landing gear according to an example.

The temperature at the fuse plug location 220a may be deemed to approach close to the temperature threshold if the peak fuse plug location temperature 410 is within a certain margin of the temperature threshold. FIG. 4b is a graph of an example of the temperature profile 404. In this example, the temperature threshold is the temperature 418. For example, if the peak fuse plug location temperature 410 reaches the temperature 420, which is a defined percentage below the temperature threshold 418, the abovementioned indication may be provided or a processor of the computing system 106 may cause a different brake to be used. The temperature 420 may be a temperature sufficiently below the temperature threshold 420 such that a significant risk of the fuse plug 220 melting is avoided. For example, the temperature 420 may be between 3% and 5% below the temperature threshold 418. The temperature 420 may, for example, be at least 6° C. below the temperature threshold 418. If the temperature at the fuse plug location 220a exceeds the temperature 420, the temperature threshold 418 may be considered reached since there is a significant risk of the fuse plug 220 melting.

As described above, in some examples, the temperature characteristic includes the determined temperature variation information and the temperature profile 404 at the fuse plug location 220a may be determined. In such examples, based on the temperature profile 404, a first cooling time for the temperature at the fuse plug location 220a to fall below a reference temperature, for example an acceptable dispatch temperature limit, may be determined. The temperature at the fuse plug location 220a may, for example, need to be under the dispatch temperature limit before the aircraft 100 is permitted to fly following a use cycle of the aircraft 100. A use cycle of the aircraft 100 may, for example, take place from when the aircraft 100 is at a departure gate before a flight to when the aircraft 100 is at an arrival gate after a flight.

In the example of FIG. 4a, the temperature 422 is the dispatch temperature limit. In this example therefore, the first cooling time $t_{cool}$ is the amount of time, according to the temperature profile 404, between the stator location 214a being at the peak stator location temperature 408 and the fuse plug location 220a cooling down to the dispatch temperature limit 422. For example, the cooling time $t_{cool}$ may be determined by adding the determined time delay $t_{delay}$ to the amount of time for the fuse plug location 220a to cool down from the peak fuse plug location temperature 410 to the dispatch temperature limit 422 according to the temperature profile 404.

The temperature characteristic may include a determined temperature increase, above the first temperature ΔS, the stator location 214a can undergo without causing the fuse plug location 220a temperature to exceed the temperature 420. The determined temperature increase may be determined based on the relationship information. The determined temperature increase may be a hypothetical temperature increase at the stator location 214a. In some examples, the difference between the temperature 420 and the peak fuse plug location temperature 410 may be determined. Based on this difference, the temperature increase above the first temperature ΔS which the stator location can undergo without causing the fuse plug location 220a temperature to exceed the temperature 420 may be determined. For example, an increase in temperature at the stator location 214a above the peak stator location temperature 408, which would correspond to an increase in temperature at the fuse plug location 220a from the peak fuse plug location temperature 410 to the temperature 420, may be determined as the determined temperature increase. This determination may for example be performed using the relationship information of Equation 1.

In some examples, a number of 'good' braking applications that can take place in the remainder of the current braking cycle may be determined based on the determined temperature increase and a predetermined temperature increase corresponding to one or more braking applications. The number of good braking applications may be a number of braking applications that are not expected to cause the temperature at the fuse plug location 220a to exceed the temperature 420 (i.e. to reach the temperature threshold 418). Therefore, the number of good braking applications, according to the present example, is the number of times the brake assembly 200 can be deployed to brake without significant risk of the fuse plug melting, given the temperature profile 404. For example, the determined temperature increase may be compared to the predetermined temperature increase.

The predetermined temperature increase may, for example, be a maximum temperature increase at the stator location 214a expected from a single application of brake assembly 200 during normal operation of the aircraft 100. For example, during a taxiing phase after landing, the predetermined temperature may be the maximum temperature increase expected from a single application of braking by the brake assembly 200 during the taxiing phase after landing. For example, it may be determined how many predetermined temperature increments may occur within the determined temperature increase at the stator location 214a, and the number of associated good braking applications may be determined based on (e.g. as that) number.

In some examples, the predetermined temperature increase may correspond to more than one braking application. For example, the predetermined temperature increase may be the average temperature increase expected over a number (e.g. five) braking applications. For example, if the determined temperature change is greater the predetermined temperature increase, it may be determined that the number of good braking applications is at least five.

If the determined temperature increase is lower than the predetermined temperature, an indication may be provided that further braking applications of brake assembly 200 may lead to the melting of the fuse plug 220. This may be because, for example, a single application of the brake assembly 200 may result in a temperature increase at the stator location 214*a* that is greater than the hypothetical determined temperature increase. For example, a processor of the computing system 106 may provide such an indication using one of the indicating devices 110. Alternatively or in addition, the processor of the computing system 106 may cause one or more different brakes than brake assembly 200 to be used for braking to avoid a significant risk of the fuse plug 220 melting. In some examples, the first temperature ΔS is already such that the temperature at the fuse plug location exceeds the temperature 420. In such examples, the fuse plug 220 may be at imminent risk of melting.

The temperature characteristic may also include a determined amount of energy the brake assembly 200 can absorb, which is in addition to the absorbed energy corresponding to the first temperature ΔS, without causing the fuse plug location 220*a* temperature to exceed the temperature 420 (i.e. reach the temperature threshold 418). The determined amount of energy may be determined using the physical properties of the brake assembly 200. As explained above, a temperature relative to the environmental temperature at the stator location 214*a* may be determined using an amount of energy absorbed by the brake assembly 200. It will be appreciated that such determinations may also be performed in reverse. From the determined temperature increase described above, the determined amount of energy may be determined using the mass and the specific heat of the brake assembly 200.

In some examples, the number of good braking applications that can take place in the remainder of the current braking cycle may be determined based on the determined amount of energy and a predetermined energy value corresponding to one or more braking applications. The amount of additional energy may be determined and compared to the predetermined energy value. The predetermined energy value may, for example, be an amount of energy expected to be absorbed by the brake assembly 200 during a single braking application during normal operation of the aircraft 100. For example, during a taxiing phase after landing, the predetermined energy value may be the maximum energy value expected to be absorbed by the brake assembly 200 from a single application of the brake assembly 200 during the taxiing phase after landing. The number of good braking application may be determined based on the comparison between the determined amount of energy and the predetermined energy value. For example, it may be determined how many predetermined energy values there are within the determined amount of energy, and the number of good braking applications may be determined as that number.

In some examples, the predetermined energy value may correspond to more than one braking application. For example, the predetermined energy value may be the average temperature increase expected over a number (e.g. five braking applications). For example, if the determined amount of energy is greater the predetermined energy value, it may be determined that the number of good braking applications is at least five.

If the determined amount of energy is lower than the predetermined energy value, an indication may be provided that further braking applications of brake assembly 200 may lead to the melting of the fuse plug 220. This is because, for example, a single application of the brake assembly 200 may result in an amount of energy absorbed by the brake assembly 200 which causes a significant risk of the fuse plug 220 melting. For example, a processor of the computing system 106 may provide such an indication using one of the indicating devices 110.

Alternatively or in addition, the processor of the computing system 106 may cause one or more different brakes than brake assembly 200 to be used for braking to avoid a significant risk of the fuse plug 220 melting.

In some examples, in order to determine the temperature increase (which may be included in the temperature characteristic) at the stator location 214*a*, which would not cause the fuse plug location 220*a* temperature to exceed the temperature 420, a third temperature at the stator location 214*a* may be determined. The third temperature may be a temperature with respect to the environmental temperature. For example, the third temperature may be a hypothetical temperature, which is the difference between a temperature at the stator location 214*a* which does not cause a significant risk of the fuse plug 220 melting, and the environmental temperature. In other words, the third temperature is an increase in stator location temperature that would not cause the temperature at the fuse plug location 220*a* to reach the temperature threshold 418 (or substantially reach the temperature threshold 418 by reaching the temperature 420).

In some examples, to determine the third temperature, a fourth temperature $\Delta FP_{Threshold}$ at the fuse plug location 220*a* may be determined. The fourth temperature $\Delta FP_{Threshold}$ may be the difference between the temperature 420 below the temperature threshold 418 and the environmental temperature 406. The value of the third temperature may, for example, be determined using relationship information which indicates a relationship between a temperature at the fuse plug location 220*a* and a temperature at the stator location 214*a*, such as the relationship information of Equation 1. For example, it will be appreciated that Equation 1 above may generally be used as a relationship between a temperature at the fuse plug location 220*a* and a temperature at the stator location 214*a*. Therefore, the fourth temperature $\Delta FP_{Threshold}$ may be input into Equation 1 in place of the first temperature ΔFP in order to determine the third temperature at the stator location 214*a*. Since the fourth temperature $\Delta FP_{Threshold}$ goes up to a peak temperature without significant risk of the fuse plug 220 melting, the third temperature at the stator location 214*a* determined in this manner is a temperature at the stator location 214*a* which does not cause a significant risk of the fuse plug 220 melting. The difference between the third temperature and the first temperature ΔS may be determined as the determined temperature increase included in the temperature characteristic. If the third temperature is lower that the first temperature ΔS, the fuse plug 220 may be at imminent risk of melting. It will be appreciated that the third temperature may be determined prior to the first temperature at the stator location 214*a* occurring. This is because the third temperature can be determined based on the temperature 420, the environmental temperature 406 and the relationship information.

The number of good braking applications may, for example, be determined based on the determined temperature increase, which is determined using the third temperature. The determined amount of energy which the brake assembly can absorb without causing the fuse plug location 220*a* temperature to exceed the temperature 420 may be determined based on the determined temperature increase, which is determined using the third temperature. For example, the amount of energy leading to the difference between the third temperature and the first temperature ΔS may be determined as the determined amount of energy. The number of good braking application may, for example, be determined based on the determined amount of energy, which is determined using the third temperature.

A processor of the computing system 106 may, for example, provide an indication using an indicating device included in the indicating devices 110 regarding the number of good braking applications to the pilot(s) of the aircraft 100. The pilot(s) may thus adjust their braking behaviour. A processor of the computing system 106 may for example, cause various different sets of brakes to be used such that the number of braking applications applied by the brake assembly 200 does not exceed the number of good braking applications.

In some examples, a second cooling time for the temperature at the fuse plug location 220a to fall below a reference temperature (e.g. the dispatch temperature limit) may be determined based on the temperature profile. In such examples, the temperature profile may be updated to account for the determined temperature increase/determined amount of energy absorbed. For example, the temperature profile may be updated to be a predicted temperature profile at the fuse plug location 220a if the third temperature were to occur. The second cooling time may therefore be the time for the fuse plug location temperature to decrease to the dispatch temperature limit 422 if the determined temperature increase were to occur. For example, the second cooling time may be the time from the third temperature change occurring to the time at which the fuse plug location temperature decreases to the dispatch temperature limit 422 according to the predicted temperature profile.

A method of determining relationship information between a temperature characteristic at a first location of the wheel 104 or a brake assembly 200 of an aircraft landing gear 102 and a temperature at a second location of the wheel 104 or the brake assembly 200 of the aircraft landing gear 102 will now be described. The relationship information may be determined using a two-dimensional or three-dimensional computational fluid dynamics (CFD) model of the brake assembly 200 and the wheel 104. For example, using the CFD model, sets of temperatures at the stator location 214a and the fuse plug location 220a with respective time data may be determined. For example, using the CFD model, the variation of temperature with time at the stator location 214a, and the corresponding variation of temperature with time at the fuse plug location 220a may be determined for different braking energies. The CFD model may, for example, be used to simulate various types of braking events to determine the respective variations of temperature. The relationship information may be determined from the respective temperature variations from the CFD model. For example, the functional forms of Equations 1 to 4 and the values of constants which may appear in those equations may be determined using the CFD simulation data. For example, where the functional forms of the relationships are as described by Equation 1, 2, 3 and 4, the values of the constants A, B, C, D, E, $F_H$, $G_H$, $F_C$ and $G_C$ may also be determined using the respective temperature variations from the CFD model. For example, a value for each of the constants may be determined for one or more combinations of the brake wear state and the brake cooling fan 222 being on or off. Those skilled in the art will appreciate that given a set of corresponding values of two different parameters, a relationship between those parameters in the form of a mathematical expression along with the values of any constants may be determined.

In some examples, the relationship information may be determined using actual data of the temperature variation with time at the stator location 214a and the fuse plug location 220a. The actual data may be data collected during use of an aircraft such as aircraft 100, for example. In some examples, the actual data may be acquired during tests carried out on the brake assembly 200 and the wheel 104. For example, the temperature variation at the stator location 214a may be measured using a temperature sensor such as temperature sensor 218. In addition, a second temperature sensor may be positioned close to or at the fuse plug location 220a to measure the temperature variation at the fuse plug location 220a. This actual data of the respective temperature variations may be used to determine the relationship information. For example, the functional forms of Equations 1, 2, 3 and 4 and the values of constants which may appear in those equations may be determined using the actual data. For example, where the functional forms of the relationships are as described by Equation 1, 2, 3 and 4, the values of the constants A, B, C, D, E, $F_H$, $G_H$, $F_C$ and $G_C$ may also be determined using the respective temperature variations from the actual data. For example, a value for each of the constants may be determined for one or more combinations of the brake wear state and the brake cooling fan 222 being on or off.

In some examples, the relationship information may be determined using an analytical model. For example, the dependence of the variation of the temperature at the fuse plug location 220a on the variation of the temperature at the stator location 214a may be solved for analytically. Using the results from the analytical model, an expression for each example of relationship information mentioned above may be determined (e.g. Equations 1 to 4). The values of any constants appearing in those expressions may also be determined using the results of the analytical model for one or more combinations of the brake wear state and the brake cooling fan 222 being on or off, for example.

All or part of any of the above methods may also be performed to recalculate the temperature characteristic after a braking event which occurs subsequent to the first temperature ΔS. For example, it may be determined whether a braking event subsequent to the first temperature ΔS has occurred. For example, a subsequent braking event may cause a subsequent temperature peak at the stator location 214a after the peak stator location temperature 408 of FIG. 4a. For example, a temperature relative to the environmental temperature corresponding to the subsequent temperature peak may be determined and the relationship information may be used based on that relative temperature to recalculate the temperature characteristic. For example, the temperature profile 404 may be updated to account for subsequent temperatures where the temperature at the stator location 214a increases due to braking.

All or part of the above described methods or any of their variations may be performed by a processor of the computing system 106 of the aircraft 100, for example, based on instructions stored in a computer readable storage medium of the computing system 106. For example, the method 300 may be performed by the computing system 106 of the aircraft 100 where the temperature characteristic includes the determined second temperature ΔFP, the determined time delay $t_{delay}$ and the determined temperature variation information for the fuse plug location 220a. The computing system 106 may also determine the temperature profile 404 at the fuse plug location 220a. The processor of the computing system 106 may also perform one or more of any other example described above. As described above, a processor of the computing system 106 may provide indications, for example, indications to the pilot(s) of the aircraft 100 using one or more of the indicating devices 110. The computing system 106 may alternatively or in addition automatically cause a different brake or set of brakes to be used instead of brake assembly 200 when the fuse plug 220 is at a significant risk of melting if brake assembly 200 continues to be used.

For example, the determination of the relationship information using CFD model, actual data, analytical calculations or the like as described above may also be performed by the computing system 106.

All or part of the above described methods or any of their variations may be performed by a computing apparatus such as computing apparatus 500 shown in FIG. 5, for example. The computing apparatus 500 may be external to the aircraft 100. Computing apparatus 500 may comprise a processor 502 and a computer readable storage medium 504. The processor 502 may be configured to execute instructions stored on the storage medium 504. The storage medium 504 may store instructions for performing all or part of any of the above described methods. For example, any of the above examples of the method 300 may be performed by the computing apparatus 500. For example, the temperature variation data for the stator location 214a may be provided to the computing apparatus from the aircraft 100. The computing apparatus 500 may, for example, determine whether the fuse plug was at a significant risk of melting at any point according to the data from the aircraft 100. For example, the computing apparatus 500 may determine if the temperature at the fuse plug location reached or exceeded the temperature 420. The computing apparatus may, for example, perform the determination of the relationship information using CFD model, actual data, an analytical model or the like as described above. In some examples, the relationship information may be determined by the computing apparatus 500 and then stored in a computer readable storage unit of the computing system 106. In this way, the computing system 106 may implement any of the above described method to determine the temperature characteristic using relationship information determined by the computing apparatus 500.

In some examples, a computer readable storage unit of the computing system 106 may store look-up tables which relate the first temperature to the temperature characteristic. In these examples, the look-up tables may be used instead of directly using the above described relationship information to determine the temperature characteristic. For example, a look-up table may be stored for one or more combinations of the brake wear state, the brake cooling fan 222 being on or off, and for one or more of the examples of information included in the temperature characteristic described above. For example, a look-up table may contain a plurality of corresponding pairs of values of an example of information included in the temperature characteristic for a given brake wear state and a given on/off status of the brake cooling fan 222. In a specific example, a look-up table may contain a plurality of corresponding pairs of values of the second temperature and the first temperature for a brake wear state indicating zero brake wear and the brake cooling fan 222 being off. For example, when the temperature characteristic is to be determined, a look-up table may be chosen according to the brake wear state and the status of the brake cooling fan 222. Then, the value of the example of information included in the temperature characteristic in question corresponding to the first temperature (determined based on measurements from the temperature sensor 218).

The above mentioned look-up tables may be generated according to the examples of the relationship information described above. The look-up table may, for example, be generated by a processor of the computing system 106. In some examples, the look-up tables may be generated by the computing apparatus 500.

All or part of the instructions for performing the above described methods may be generated and/or the methods may be performed using any suitable software or combination of software. In one example, "MATLAB" may be used to generate all or part of the instructions for a processor such as processor 502 or a processor of computing system 104 to carry out any of the above methods. In other examples, other software packages may be used. For example, any suitable programming language, development environment, software package, or the like may be used. Other examples of programming languages include PYTHON, C++, C, JAVASCRIPT, FORTRAN etc.

It is to noted that the term "or" as used herein is to be interpreted to mean "and/or", unless expressly stated otherwise. It will appreciated that the temperature characteristic determined according to the above methods may be an expected temperature characteristic which is expected according to the model(s) applied in order to determine the relationship information.

The invention claimed is:

1. An apparatus for determining a temperature characteristic at a first location on a wheel or a brake assembly of an aircraft landing gear, the apparatus comprising:
a processor configured to:
determine the temperature characteristic at the first location on the wheel or the brake assembly of the aircraft landing gear during one or more braking events or braking cycles, using relationship information based on a first temperature taken at a second location of the wheel or the brake assembly of the aircraft landing gear, the relationship information representing a relationship between the temperature characteristic at the first location and the first temperature,
wherein:
the temperature characteristic comprises a determined second temperature at the first location;
the relationship information comprises an indication of the relationship between a temperature at the first location and a temperature at the second location; and
the temperature characteristic further comprises:
a determined temperature increase above the first temperature that the second location can undergo, or a determined amount of energy the brake assembly can absorb, which is in addition to the absorbed energy corresponding to the first temperature, during a current braking cycle, without causing the temperature at the first location to reach a predetermined temperature threshold.

2. The apparatus according to claim 1, wherein:
the first location is a location of a fuse plug of the wheel of the aircraft landing gear and the second location is a location of a brake disc of the brake assembly of the aircraft landing gear.

3. The apparatus according to claim 1, wherein the processor is further configured to determine a number of good braking applications that can take place in the remainder of a current braking cycle based on the determined temperature increase and a predetermined temperature increase corresponding to one or more braking applications.

4. The apparatus according to claim 1, wherein the determined amount of energy the brake assembly can absorb is determined using physical properties of the brake assembly.

5. The apparatus according to claim 1, wherein the processor is further configured to determine a number of good braking applications that can take place in the remainder of a current braking cycle based on the determined amount of energy and a predetermined energy value corresponding to one or more braking applications.

6. The apparatus according to claim 1, wherein:
the temperature characteristic further comprises a determined time delay between the first temperature occurring at the second location and the second temperature occurring at the first location; and
the relationship information comprises an indication of the relationship between the determined time delay and the first temperature.

7. The apparatus according to claim 6, wherein:
the temperature characteristic further comprises determined temperature variation information of the temperature at the first location;
the relationship information comprises an indication of the relationship between the determined temperature variation information and the first temperature; and
the processor is further configured to determine a temperature profile of the first location with respect to time based on the temperature characteristic and an environmental temperature.

8. The apparatus according to claim 7, wherein the determined temperature variation information comprises a heating time constant and a cooling time constant.

9. The apparatus according to claim 7, wherein the processor is further configured to determine a cooling time for the temperature at the first location to fall below a reference temperature limit based on the temperature profile.

10. The apparatus according to claim 1, wherein the processor is further configured to provide an indication on the basis of the temperature characteristic at the first location.

11. The apparatus according to claim 1, wherein the processor is further configured to recalculate the temperature characteristic after a braking event which occurs subsequent to the first temperature.

12. The apparatus according to claim 1, wherein the processor may automatically cause a different brake than the brake assembly to be used for braking.

13. The apparatus of claim 1, further comprising a sensor, wherein the first temperature is taken at the second location of the wheel or the brake assembly of the aircraft landing gear using the sensor.

14. A method for determining a temperature characteristic at a first location on a wheel or a brake assembly of an aircraft landing gear, the method comprising:
inputting a first temperature at a second location of the wheel or the brake assembly of the aircraft landing gear; and
determining a temperature characteristic at the first location on the wheel or the brake assembly of the aircraft landing gear during one or more braking events or braking cycles, using relationship information based on the first temperature, the relationship information representing a relationship between the temperature characteristic at the first location and the first temperature, wherein:
the temperature characteristic comprises a determined second temperature at the first location;
the relationship information comprises an indication of the relationship between a temperature at the first location and a temperature at the second location; and
the temperature characteristic further comprises:
a determined temperature increase above the first temperature that the second location can undergo, or a determined amount of energy the brake assembly can absorb, which is in addition to the absorbed energy corresponding to the first temperature, during a current braking cycle, without causing the temperature at the first location to reach a temperature threshold.

15. The method according to claim 14 comprising determining a number of good braking applications that can take place in the remainder of a current braking cycle based on the determined temperature increase and a predetermined temperature increase corresponding to one or more braking applications.

16. The method according to claim 14, wherein the determined amount of energy the brake assembly can absorb is determined using physical properties of the brake assembly.

17. The method according to claim 14 comprising determining a number of good braking applications that can take place in the remainder of a current braking cycle based on the determined amount of energy and a predetermined energy value corresponding to one or more braking applications.

18. The method according to claim 14, wherein:
the temperature characteristic further comprises a determined time delay between the first temperature occurring at the second location and the second temperature occurring at the first location; and
the relationship information further comprises an indication of the relationship between the determined time delay and the first temperature.

19. The method according to claim 18, wherein:
the temperature characteristic further comprises determined temperature variation information of the temperature at the first location;
the relationship information further comprises an indication of the relationship between the determined temperature variation information and the first temperature; and
the method comprises determining a temperature profile of the first location with respect to time based on the temperature characteristic and environmental temperature.

20. The method according to claim 19 comprising determining a cooling time for the temperature at the first location to fall below a reference temperature limit based on the temperature profile.

21. A method according to claim 14 comprising recalculating the temperature characteristic after a braking event which occurs subsequent to inputting the first temperature.

22. The method according to claim 14, further comprising automatically causing a different brake than the brake assembly to be used for braking.

* * * * *